United States Patent [19]

Dimeff et al.

[11] Patent Number: 4,527,419

[45] Date of Patent: Jul. 9, 1985

[54] SENSOR FOR UNDERGROUND DUCT PROBE

[75] Inventors: John Dimeff; Clyde R. Stewart, both of San Jose, Calif.

[73] Assignee: Mark Telephone Products, Inc., Santa Clara, Calif.

[21] Appl. No.: 497,314

[22] Filed: May 23, 1983

[51] Int. Cl.³ .............................................. G01M 3/24
[52] U.S. Cl. .................. 73/40.5 A; 73/661; 310/334; 310/356
[58] Field of Search .............. 73/40.5 A, 592, 661; 310/345, 334, 336, 348, 355, 356; 367/165, 180

[56] References Cited

U.S. PATENT DOCUMENTS

| | | | |
|---|---|---|---|
| 2,395,034 | 2/1946 | Bokovoy | 310/356 |
| 3,168,824 | 2/1965 | Florer et al. | 73/40.5 A |
| 3,363,450 | 1/1968 | Simpkins et al. | 73/40.5 A |
| 3,745,829 | 7/1973 | Franchi | 310/336 |

Primary Examiner—Stewart J. Levy
Assistant Examiner—John E. Chapman, Jr.
Attorney, Agent, or Firm—Townsend and Townsend

[57] ABSTRACT

A sensor for use on the front end of a flexible, resilient probe for use in an underground duct of the type which contains one or more current-carrying cables. The sensor is provided with a signal generating device for detecting a particular operating condition of a cable in the duct when the sensor moves through the duct adjacent to the cable. In one embodiment of the sensor, acoustical signals are sensed by a crystal when such acoustical signals originate from a leak in the pressurized sheath surrounding the cable. In another embodiment of the sensor, a coil senses the magnetic field surrounding the cable so that electrical shorts occurring in the cable can be monitored. In a third embodiment of the sensor, a heat detector is provided so that the sensor can detect hot spots in a duct.

9 Claims, 9 Drawing Figures

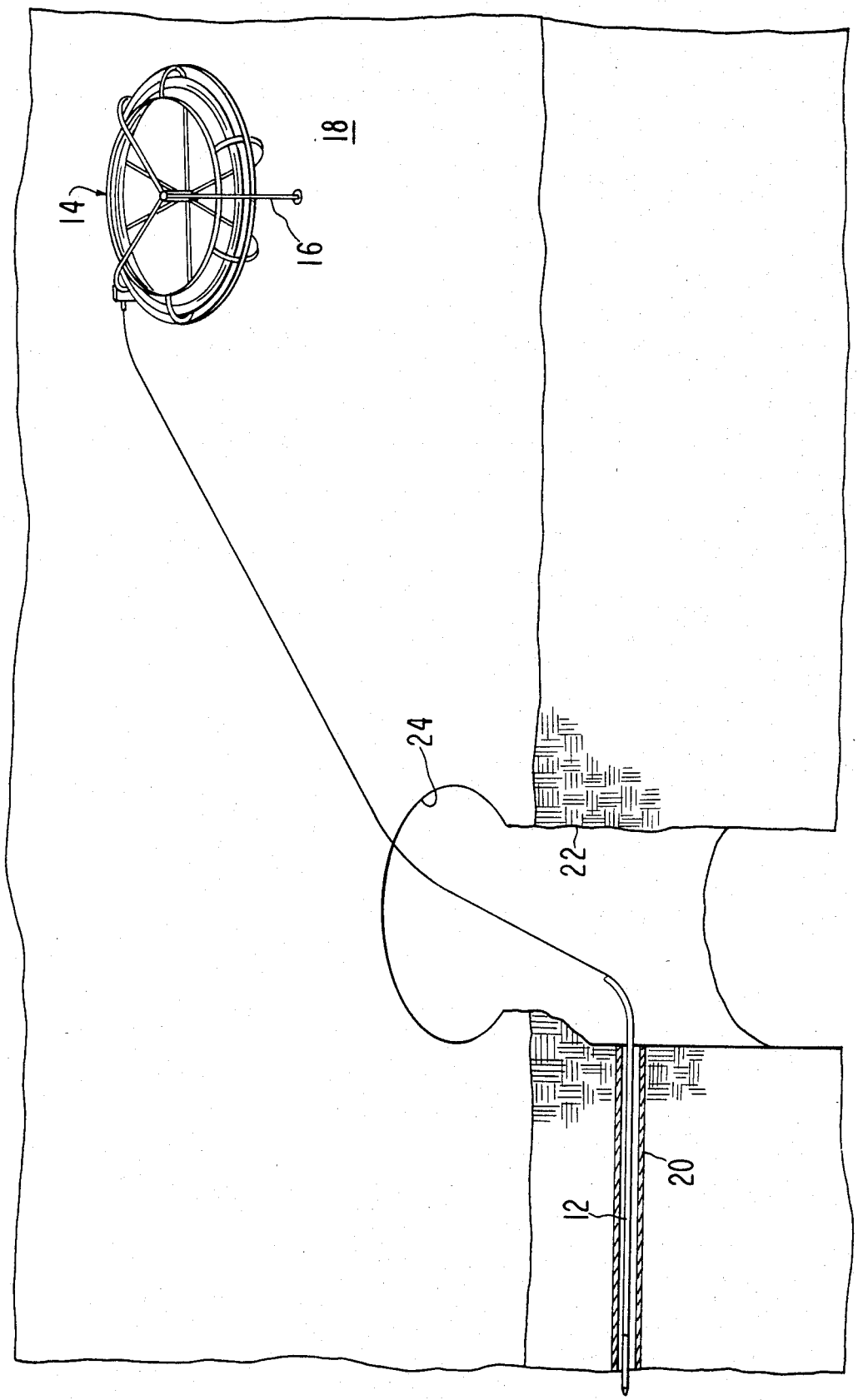

SENSOR FOR UNDERGROUND DUCT PROBE

This invention relates to improvements in the way in which underground cables are monitored and, more particularly, to an improved sensor for an underground duct probe containing a cable which carries an electrical current.

BACKGROUND OF THE INVENTION

Sensors for underground duct probes have been used in the past for detecting ultrasonic vibrations in underground ducts. Such ultrasonic vibrations are generally due to the leaking of air or other gases in pressurized sheaths around underground cables in the ducts. A sensor for this use is normally attached to the front end of a flexible carrier comprised of a number of interconnected rods.

Heretofore, conventional sensors for this purpose have been complex in construction in that they are highly specialized and require a considerable amount of circuitry. Because of such conventional probes, a need exists for improvements such that the sensors will be simpler in construction, and easier to use, yet are removable from their carriers so as to allow for variations in the applications to which they are put.

SUMMARY OF THE INVENTION

The present invention satisfies the aforesaid need by providing an improved sensor for an underground duct probe wherein the sensor is simple and rugged in construction, can be removably mounted on the end of a duct probe carrier rod, and can be of anyone of several different types for the monitoring of different operating characteristics of a cable in an underground duct. In one form of the sensor, a crystal is mounted such that it senses sonic and ultrasonic vibrations in the vicinity of the sensor due to a leak in the pressurized sheath surrounding an underground telephone cable. The crystal is mounted on a base forming a part of the sensor in such a way that the side margins of the crystal mechanically engage the inner surface of a removable tube on the base. Thus, exterior sonic and ultrasonic vibrations sensed by the tube will be transmitted directly to the crystal, and the crystal will be set into vibration to generate a signal which is amplified and then directed along a coaxial cable embedded in the carrier rod for monitoring by equipment remote from the sensor itself.

In another embodiment of the sensor, a coil surrounding a high permeability core is mounted on a base in the sensor, and the sensor is directed into and through an underground duct adjacent to a current-carrying cable. The coil can sense changes in the magnitude of the magnetic field surrounding the cable due to the current flow therethrough. For instance, an electrical short circuit in the cable can be sensed at a particular location along the cable, by sensing the absence of a magnetic field after passing the location. This condition can be indicated on monitoring equipment at a remote location.

Still another embodiment of the sensor of the present invention is one which uses a heat detector, such as a thermocouple, mounted on a base forming a part of the sensor itself. The thermocouple is surrounded by a tube which conducts heat so that such radiation emanating in an underground duct can energize the heat detector when the sensor is adjacent to a hot spot in the duct. The signal generated by the detection of the heat is then used to determine the location of the hot spot by monitoring equipment remote from the sensor itself.

The primary object of the present invention is, therefore, to provide an improved sensor for an underground duct probe wherein the sensor is simple and rugged in construction, is highly reliable in use, and can be made at minimum cost and used without special skills on the part of the operator of the duct probe.

Another object of the present invention is to provide a sensor of the type described which is removably mounted on the front end of a probe and interchangeable with other probes so that a number of different operating conditions of an underground cable can be monitored.

Other objects of this invention will become apparent as the following specification progresses, reference being had to the accompanying drawings for an illustration of the invention.

IN THE DRAWINGS

FIG. 9 is a perspective view of the sensor of the present invention on the end of a flexible duct probe, showing the way in which the probe is inserted into an underground duct through an open manhole.

Figure 1:
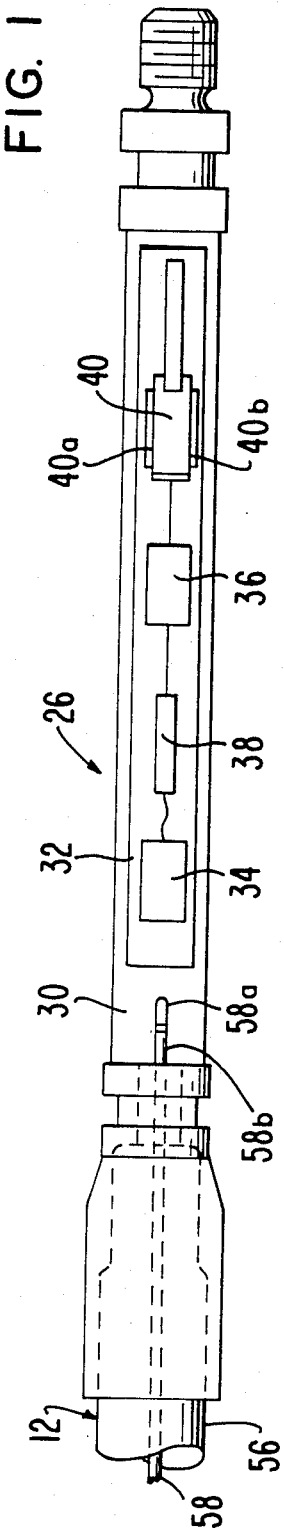
FIG. 1 is a plan view of a sensor for an underground duct probe, the sensor having a crystal for detecting a sonic signal in an underground duct.

The present invention is directed to a sensor for insertion into an underground duct, such as a duct used for holding telephone cables and the like. FIG. 9 shows the sensor of the present invention, denoted by the numeral 10, on the outer end of a flexible, highly resilient carrier rod 12 of suitable material, such as fiberglass. The rod is of a one-piece construction and is capable of being wound on a portable reel 14. The rod has a coaxial cable embedded therein. The reel 14 is wound on a base 16 which rests on the ground surface 18, yet the reel can rotate relative to the base to unwind the rod and force the rod through an underground duct 20 which communicates with a manhole 22 having an open top 24.

A first embodiment of the sensor of the present invention is shown in FIGS. 1–5 and broadly denoted by the numeral 26. Sensor 26 includes a base 28 having a flat upper surface 30 for mounting a printed circuit board 32 containing a number of components, such as transistors 34 and 36, resistors 38 and 39, and a crystal 40. The crystal is carried on a resilient pad 42 supported on printed circuit board 32. The various components are coupled in a circuit by electrical wires 44 and by electrical connections (not shown) on the printed circuit board 32. A leaf spring 46 is carried by a screw 48' on printed circuit board 32, and spring 46 has an end which bears against one end portion of crystal 40 to cause the opposite end portion of the crystal to be tipped up toward and biased against the tube 48, yet allow the crystal to vibrate at its natural frequency when energized by a sonic signal.

Figure 3:
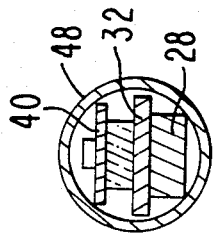
FIG. 3 is a cross-sectional view taken along line 3—3 of FIG. 2.

Base 28 is surrounded by a removable, metallic tube 48 which is of a diameter such that crystal 40 is in contact at its opposed side edges 40a and 40b (FIG. 1) with the inner surface of tube 48 in the manner shown in FIG. 3. Thus, any sonic and/or ultrasonic vibrations which are directed toward and against tube 48 will, through mechanical contact, be sensed by crystal 40 to cause an electrical signal to be generated which can be amplified and directed through the coaxial cable of carrier rod 12 to electrical measurement equipment adjacent to reel 14 (FIG. 9) for monitoring purposes.

Sensor 26 further has a head 50 at its front end which threads onto a member 52 at the front end of base 28. At the rear end of the base, a connector member 54 is removably mounted on the front end 56 of carrier rod 12 (FIGS. 2 and 9), and the rod has a coaxial cable 58 which makes electrical contact with the circuitry on printed circuit board 32.

Figure 5:
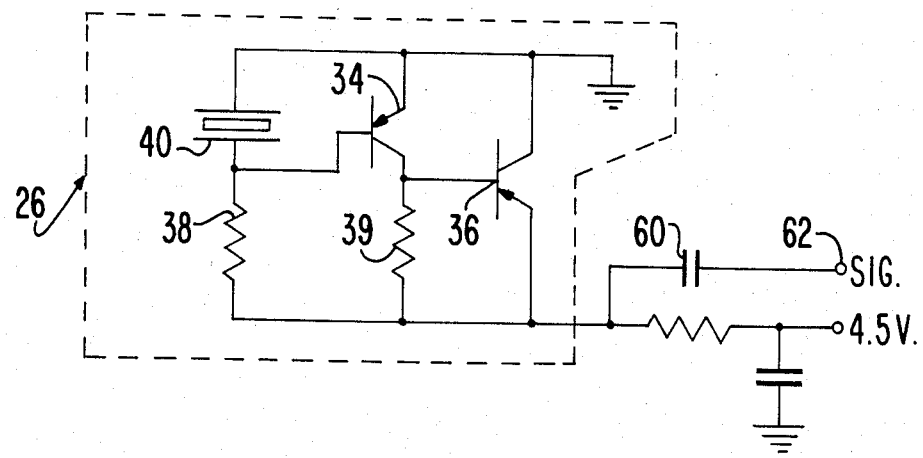
FIG. 5 is a schematic diagram of the electrical circuit containing the crystal in the sensor of FIGS. 1–4.

The electrical circuitry containing crystal 40 is shown in FIG. 5, the circuitry being comprised of transistors 34 and 36 coupled with the crystal 40 in a manner to amplify the electrical signals generated by the crystal. The signal from the crystal is directed through a filter capacitor 60 to an output terminal 62 which couples with a pin 58a (FIGS. 1 and 2) forming a part of the coaxial cable 58. The grounded portion of cable 58 is denoted by the numeral 58b.

Figure 2:
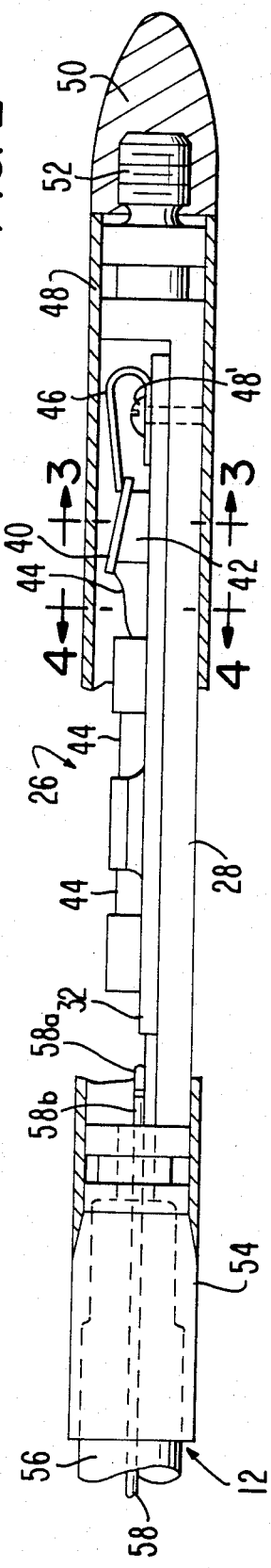
FIG. 2 is a side elevational view, partly broken away and in section, of the sensor of FIG. 1.
Figure 4:
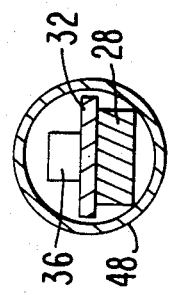
FIG. 4 is a cross-sectional view taken along line 4—4 of FIG. 2.

In operation, sensor 26 is mounted on carrier rod 12 at the front end position thereof (FIG. 9). The rod is fed off reel 14 and then into and through duct 20 which normally houses a pressurized cable, such as a telephone cable (not shown in FIG. 9). Any leak in the casing of the cable will cause a hissing sound which is a sonic or ultrasonic signal cable of being sensed by crystal 40 by virtue of its mechanical contact with the inner surface of tube 48 (FIG. 2). When a sonic and/or ultrasonic signal is sensed by the crystal, an electrical signal is generated by the crystal and amplified by the circuitry of FIG. 5. The amplified signal will then be directed along the coaxial cable in carrier rod 12 to monitoring equipment adjacent to reel 14. The reel will be associated with a length measuring device which will indicate the distance travelled from the entrance of duct 20 to the location of the leak in the telephone cable. Workmen can then drill into the ground to the cable and repair such cable to eliminate the leak.

When the entire length of the underground duct 20 has been traversed by the sensor, the sensor is retracted by reeling in rod 12 until the sensor is out of the underground duct. The sensor can then be removed from the rod and placed in a case for safekeeping until it is ready for use again.

Figure 6:
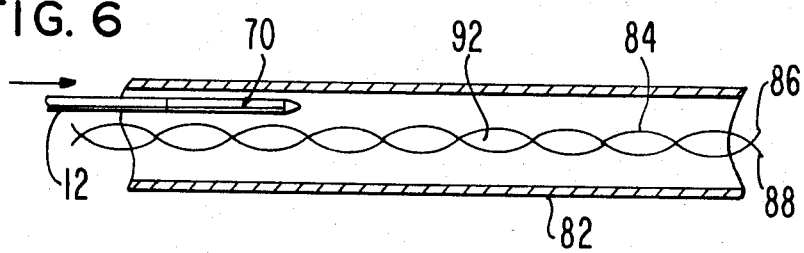
FIG. 6 is a fragmentary, cross-sectional view of an underground duct, showing a telephone cable in the duct and a second embodiment of the present invention coupled to a flexible carrier rod, with the sensor being adjacent to the telephone cable.
Figure 7:
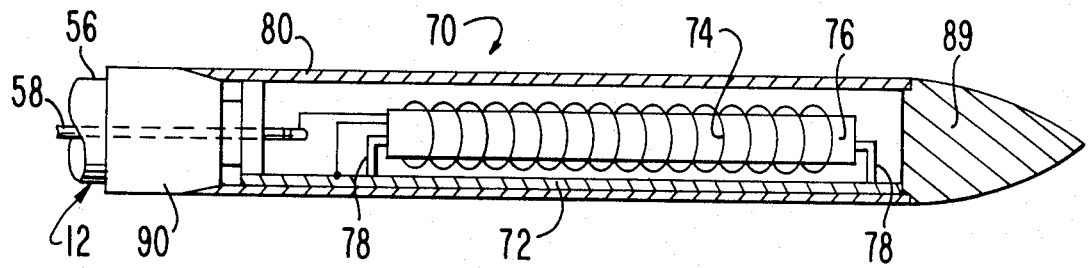
FIG. 7 is an enlarged, cross-sectional view of the probe of FIG. 6, showing the way in which a coil is wound around a high permeability core in the sensor for detecting electromagnetic radiation emanating from the telephone cable of FIG. 6.

Another embodiment of the sensor of the present invention is broadly denoted by the numeral 70 and is shown in FIG. 7. The probe includes a base 72 and a coil 74 surrounding a high permeability core 76 coupled in any suitable manner, such as by end elements 78, to base 72. The coil is surrounded by a removable tube 80 which is transparent to magnetic lines of flux so that a magnetic field can induce an electrical signal in coil 74 when the coil is moved through an underground duct, such as a duct 82 (FIG. 6) containing a telephone cable 84 which is comprised of a pair of leads 86 and 88 that are wrapped about each other in a braided fashion.

Probe 70 further includes a head 89 coupled at the front end of tube 80, and a rear mounting member 90 to which the front end 56 of rod 12 is removably secured. The coaxial cable 58 in rod 12 is coupled to coil 74 so that any signal induced in coil 74 will be directed rearwardly through the coaxial cable to monitoring equipment adjacent to reel 14.

In use, sensor 70 is removably mounted on the front end 56 of rod 12 (FIG. 6), and the rod is fed through an underground duct 82 alongside telephone cable 84. A tone typically of 577.5 Hz interrupted every one-half second is applied to a pair of conductors within the cable which is being tested for a fault. These tones are used for monitoring purposes. These tones in the form of signals generate an electric field surrounding cable 84 and, when the coil 74 is adjacent to cable 84, the magnetic field associated with the signal current flow through cable 84 will induce a signal in coil 74 which will be directed along coaxial cable 58 to the monitoring equipment adjacent to reel 14. If an electrical short occurs between the two leads 86 and 88 of cable 84, such as at a location 92, or between one of the leads and some other conductors, or between one of the leads and ground, no magnetic field will exist after passing this point, and the sensor will detect the absence of a magnetic field by a zero signal at the monitoring equipment. Thus, the sensor will monitor any short circuit conditions with respect to cable 80; thus, if a short does exist, the distance along the duct 82 can be determined by the length measuring device carried by reel 14. Thus, the necessary steps can then be taken to eliminate the source of the short.

Figure 8:
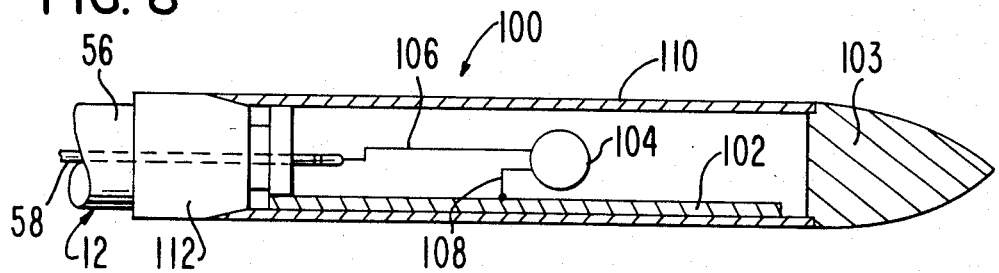
FIG. 8 is a view similar to FIG. 7, but showing a third embodiment of the sensor of the present invention, the sensor having a thermocouple for detecting heat energy in an underground duct.

Another embodiment of the sensor of the present invention is broadly denoted by the numeral 100 and is shown in FIG. 8. Sensor 100 has a base 102 on which is mounted a thermocouple 104 having leads 106 and 108. A tube 110 which conducts heat surrounds base 102 and thermocouple 104 so that, when heat energy is in the vicinity of sensor 100, the heat energy will penetrate tube 110 and energize the thermocouple. When this occurs, a signal is generated, and the signal passes through coaxial cable 58 of rod 12 which is removably secured at its front end 56 to the connecting member 112 of sensor 100. Thus, as the sensor is directed through an underground duct, the sensor will detect hot spots in the duct. This condition can then be monitored by the equipment adjacent to reel 14.

What is claimed is:

1. A sensor for an underground duct probe containing a current-carrying cable, the probe being adapted to be inserted in an underground duct of the type containing an underground cable, the sensor comprising: a base; means mounted on the base for generating an electrical signal in response to a particular operating condition of the underground cable when the sensor is in the underground duct adjacent to the cable; and a cover over the signal generating means, the cover having a cylindrical inner surface and being of a material permitting the signal generating means to be responsive to the condition when the sensor is adjacent to the cable, said base having means for removably mounting the same on a carrier rod for inserting the sensor into the underground duct; the signal generating means including a crystal having an edge circumscribing at least a portion of the crystal, and means mounting the crystal on the base in a manner that biases at least a portion of said edge in contact with the inner surface of the cover.

2. A senser set forth in claim 1, wherein said crystal mounting means includes a leaf spring biasing the crystal against the inner surface of the cover.

3. A sensor set forth in claim 1, wherein the crystal has a pair of corners biased in engagement with the inner surface of the cover at spaced locations thereon.

4. A sensor set forth in claim 1, wherein the base has a sleeve for removably receiving one end of a carrier rod having a coaxial cable therein, there being a circuit defining a signal amplifier on the base, and means on the base for coupling the amplifier to the coaxial cable when the sleeve is mounted on the rod.

5. A sensor set forth in claim 1, wherein the mounting means includes a resilient member that mounts the crystal to the base and bias the portion of said edge in contact with the inner surface of the cover.

6. The sensor set forth in claim 5, wherein the mounting means includes a leaf spring that, in conjunction with the resilient member, biases the portion of said edge in contact with the inner surface of the cover.

7. A sensor for insertion into an underground duct of the type containing a cable, the sensor comprising:
  a base;
  means mounted on the base for generating an electrical signal in response to a particular operating condition of the cable when the sensor is in the underground duct and adjacent the cable, the generating means including a crystal configured to have at least one edge portion upon which is formed at least two corner points;
  a cover over the signal generating means, the cover being configured to have an inner cylindrically-shaped surface and of a material permitting the signal generating means to be responsive to the condition when the sensor is adjacent to the cable; and
  means for mounting the crystal on the base in a manner that biases the two corner points in contact with the cylindrically-shaped inner surface of the cover.

8. The sensor set for in claim 7, wherein the mounting means includes a resilient member for biasing the two corner points in contact with the cylindrically-shaped inner surface of the cover.

9. A sensor for insertion into an underground duct of the type containing a cable, the sensor comprising:
  a base, the base including means for removably mounting the same on a carrier rod for inserting the sensor into the underground duct;
  circuit means mounted on the base for generating an electrical signal in response to a particular operating condition of the cable when the sensor is in the underground duct and adjacent to the cable, the circuit means including a crystal configured to have a first dimension that terminates at one end thereof in at least a pair of corner points;
  a cover over the circuit means, the cover being configured to have a cylindrical inner surface and of a material permitting the circuit means to be responsive to the condition when the sensor is adjacent to the cable; and
  means for mounting the crystal on the base in a manner that biases the pair of corner points in contact with the cylindrical inner surface of the cover, the mounting means including a resilient pad for holding the crystal to the base and a leaf spring in engagement with the crystal to, in operative cooperation with the resilient pad, bias said pair of corner points in contact with the inner surface of the cover.

* * * * *